United States Patent
Yao et al.

(10) Patent No.: US 10,629,282 B1
(45) Date of Patent: Apr. 21, 2020

(54) E-FUSE CIRCUIT

(71) Applicant: Elite Semiconductor Memory Technology Inc., Hsinchu (TW)

(72) Inventors: Tse-Hua Yao, Hsinchu County (TW); Yi-Fan Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 16/442,536

(22) Filed: Jun. 16, 2019

(51) Int. Cl.
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ........ G11C 17/16; G11C 17/165; G11C 17/18
USPC ......................................................... 327/525
See application file for complete search history.

(56) References Cited

U.S. PATENT DOCUMENTS

| | | | | |
|---|---|---|---|---|
| 2007/0121411 A1* | 5/2007 | Riley | ..................... | G11C 17/18 365/225.7 |
| 2009/0109790 A1* | 4/2009 | Miyatake | ............. | G11C 17/165 365/230.08 |
| 2016/0307639 A1* | 10/2016 | Lim | ........................ | G11C 17/16 |

* cited by examiner

*Primary Examiner* — John W Poos
(74) *Attorney, Agent, or Firm* — Winston Hsu

(57) ABSTRACT

An E-fuse circuit comprising: a ring address latch, configured to receive a first input address arranged in serial i bits responding to a first clock signal, and to output a second input address arranged in serial j bits responding to a second clock signal; a control signal generating circuit, configured to receive the second input address, and to decode the second input address to generate first control signals with m bits and second control signals with n bits, wherein the first control signals and the second control signals are transmitted in parallel, and m, n are factors of j; and an E-fuse group, comprising j fuses. If any one of the first control signals has a first logic value and any one of the second control signals has the logic value, a corresponding fuse the E-fuse group is burned.

10 Claims, 9 Drawing Sheets

US 10,629,282 B1

E-FUSE CIRCUIT

BACKGROUND OF THE INVENTION

1. Field of the Invention

The present invention relates to an E-fuse circuit, and particularly relates to an E-fuse circuit can combine input address and clock signals to save transmission lines.

2. Description of the Prior Art

Conventional memory requires two testing stages before leaving the factory; for example, a Chip Probing (CP) mode and a Final Test (FT) mode are executed to test memories. During a typical testing process, when a word line corresponding to an input address is found defective, a redundancy word line is accessed to repair the defective word line. However, certain problems need to be fixed during the CP mode and the FT mode. For example, more than one transmission lines for transmitting control signals are needed during the typical testing process.

Therefore, a novel E-fuse burning mechanism is desired.

SUMMARY OF THE INVENTION

Therefore, one objective of the present invention is to provide an E-fuse circuit and an E-fuse burning method, which can save transmission lines of the E-fuse circuit.

Another objective of the present invention is to provide an E-fuse circuit and an E-fuse burning method, which can backup input address to burn.

One embodiment of the present invention discloses an E-fuse circuit comprising: a ring address latch, configured to receive a first input address arranged in serial i bits responding to a first clock signal, and to output a second input address arranged in serial j bits responding to a second clock signal, wherein a frequency of the first clock signal is k times of a frequency of the second clock signal and k is a positive integer; a control signal generating circuit, coupled to the ring address latch, configured to receive the second input address, and to decode the second input address to generate first control signals with m bits and second control signals with n bits, wherein the first control signals and the second control signals are transmitted in parallel, and m, n are factors of j; and an E-fuse group, coupled to the control signal generating circuit, comprising j fuses. If any one of the first control signals has a logic value 1 and any one of the second control signals has a logic value 1, a corresponding fuse of the E-fuse group is burned.

In view of above-mentioned embodiments, the clock signal and the address data are combined such that only one transmission line for the combined signal is needed rather than two transmission lines respectively for the clock signal and the address data. Additionally, the latch circuit can be implemented by a ring circuit, thereby the address data can be backup during the burning operation.

These and other objectives of the present invention will no doubt become obvious to those of ordinary skill in the art after reading the following detailed description of the preferred embodiment that is illustrated in the various figures and drawings.

DETAILED DESCRIPTION

In following descriptions, several embodiments are provided to explain the concept of the present invention. Please note, the term "first", "second" are only for identifying different devices, circuits, steps or data, signals, and do not mean to limit the sequence thereof. Besides, the circuits provided in each embodiment is only for example, any circuit can achieve the same function should also be included in the scope of the present invention.

Figure 1:
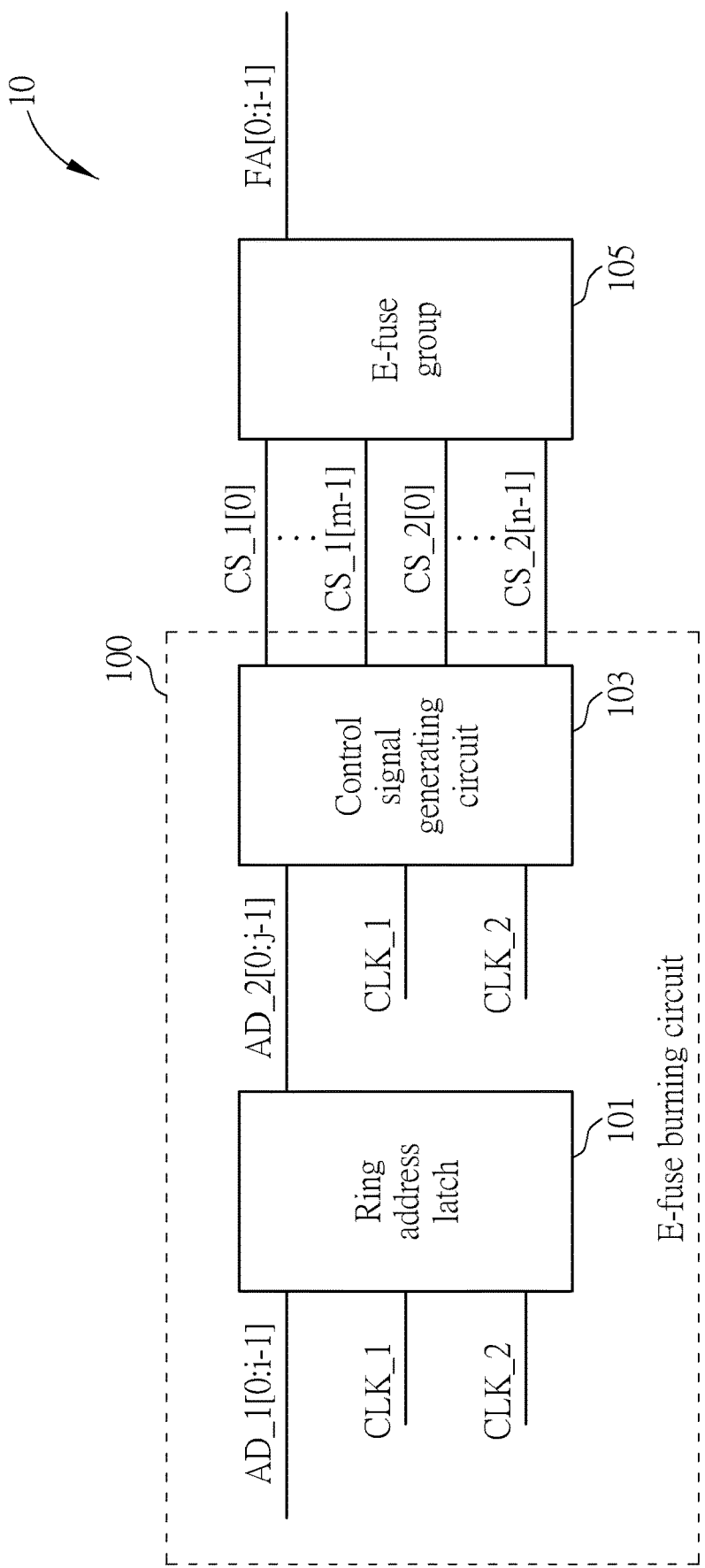
FIG. 1 is a block diagram illustrating an E-fuse circuit according to one embodiment of the present invention.

FIG. 1 is a block diagram illustrating an E-fuse circuit 10 according to one embodiment of the present invention. As illustrated in FIG. 1, the E-fuse circuit 10 comprises an E-fuse burning circuit 100 and an E-fuse group 105. The E-fuse burning circuit 100 comprises a ring address latch 101 and a control signal generating circuit 103. The ring address latch 101 is configured to receive a first input address AD_1 [0:i−1] arranged in serial i bits responding to a first clock signal CLK_1, and to output a second input address AD_2 [0: j−1] arranged in serial j bits responding to a second clock signal CLK_2. A frequency of the first clock signal CLK_1 is k times of a frequency of the second clock signal CLK_2, and k is a positive integer. The control signal generating circuit 103 is configured to receive the second input address AD_2 [0: j−1], and to decode the second input address AD_2 [0: j−1] to generate first control signals CS_1 [0:m−1] with m bits and second control signals CS_2 [0:n−1] with n bits. The first control signals CS_1 [0] . . . CS_1 [m−1] and the second control signals CS_2 [0] . . . CS_2 [n−1] are transmitted in parallel, and m, n are factors of j. The E-fuse group 105 is coupled to the control signal generating circuit 103 and comprising j fuses. If any one of the first control signals has a logic value 1 and any one of the second control signals has a logic value 1, a corresponding fuse of the E-fuse group is burned. That is, an order of the corresponding fuse corresponds to an order of the first control signal which is 1 or an order of the second control signal which is 1.

In one embodiment, the E-fuse group 105 comprises a plurality of determining switches respectively receiving different bits of the first control signals CS_1[0:m−1] and the second controls signals CS_2[0:n−1], to accordingly generate at least one fuse burning signal, which is applied to burn the fuses of the E-fuse group 105. Accordingly, which fuse is burned is determined according to the values of the first control signals CS_1[0:m−1] and the second control signals CS_2[0:n−1]. The fuse of the E-fuse circuit 105 may comprise at least one burning switch, such as a PMOS, to receive the fuse burning signal. If the burning switch is turned on and the coupled fuse is successfully burned by the fuse burning signal (e.g. change from non-conductive to conductive), the fail address FA[0: i−1] output by the fuse changes.

Figure 2:
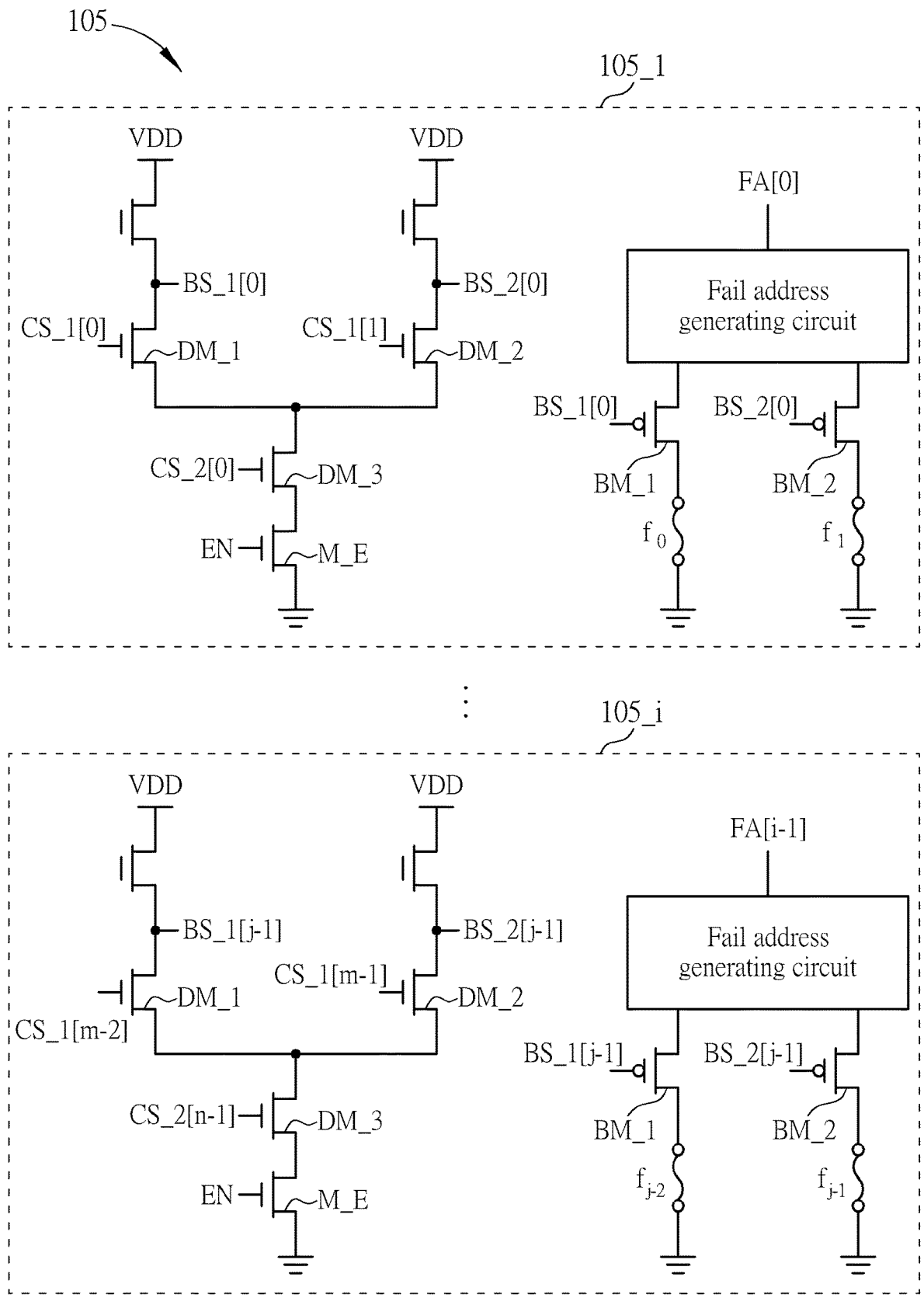
FIG. 2 is an example for the E-fuse circuit illustrated in FIG. 1.

FIG. 2 is an example for the E-fuse group 105 illustrated in FIG. 2. However, the circuits illustrated in FIG. 2 are only for the convenience of understanding and do not mean to limit the scope of the present invention. As illustrated in FIG. 2, the E-fuse group 105 comprises bit determining circuits 105_1-105_i for i bits. For example, the bit determining circuit 105_1 comprises determining switches DM_1, DM_2 and DM_3 which receive the signals (bits) CS_1[0], CS_1[1] of the first control signals CS_1 and the signals CS_2[0] of the second control signals CS_2 to generate the fuse burning signals BS_1[0], BS_2[0]. The bit determining circuit 105_1 can further comprise an enable switch M E to receive an enable signal EN to determine whether the bit determining circuit 105_1 should operate or not. In the example of FIG. 2, the logic value of the burning signal BS_1[0] is 0 if the signal CS_1[0] of the first control signals CS_1 is 1 and the signal CS_2 [0] of the second control signal is 1.

The bit determining circuit 105_i comprises a circuit structure the same as which of the bit determining circuit 105_1. However, the determining switches DM_1, DM_2 and DM_3 in the bit determining circuit 105_i respectively receives the signals CS_1[m−2], CS_1[m−1] of the first control signals CS_1 and the signal CS_2[n−1] of the second control signals CS_2 to generate the fuse burning signals BS_1[i−1], BS_2[i−2], rather than the signals CS_1[0], CS_1[1] and the signal CS_2[0].

Please refer to FIG. 2 again, the burning switches BM_1 and BM_2 respectively receive the burning signals BS_1[0], BS_2[0], and the fail address FA[0] is changed if any one of the burning switches BM_1 and BM_2 is turned on and the coupled fuses f0 and f1 are burned completely. In this embodiment, a fail address FA[0] is determined based whether the fuses f0 and f1 are successfully burned. The more the burning switches exist in one bit determining circuit and are burned one time, the higher the burning success rate is. However, each bit determining circuit can comprise only one burning switch. Since the E-fuse group 105 can comprise various structures and operations thereof are well known by persons skilled in the art, other detail descriptions of the E-fuse circuit are omitted for brevity here.

Please note, in following examples, the logic values of the signals and data are set based on the example illustrated in FIG. 2. However, persons skilled in the art can understand that the logic values of the signals and data can be changed corresponding to the circuit structure of the E-fuse circuit 105, to achieve the same function.

Please refer to FIG. 1, the ring address latch 101 receives the first input address AD_1[0:i−1] which are arranged in serial i bits, to output the second input address AD_2[0:j−1] arranged in serial j bits. In one embodiment, the second input address AD_2[0:j−1] is k times duplication data of the first input address AD_1 [0:i−1], wherein k is a positive integer and corresponds to a number of fuses to be burned (i.e. the above-mentioned fuses f0, f1) in the E-fuse group 105. For example, in one embodiment, the first input address AD_1 is 12 bits data, and the second address AD_2 is 24 bits data, in such case the burning switches for each fuse is 2, such as the example illustrated in FIG. 2.

Figure 3:
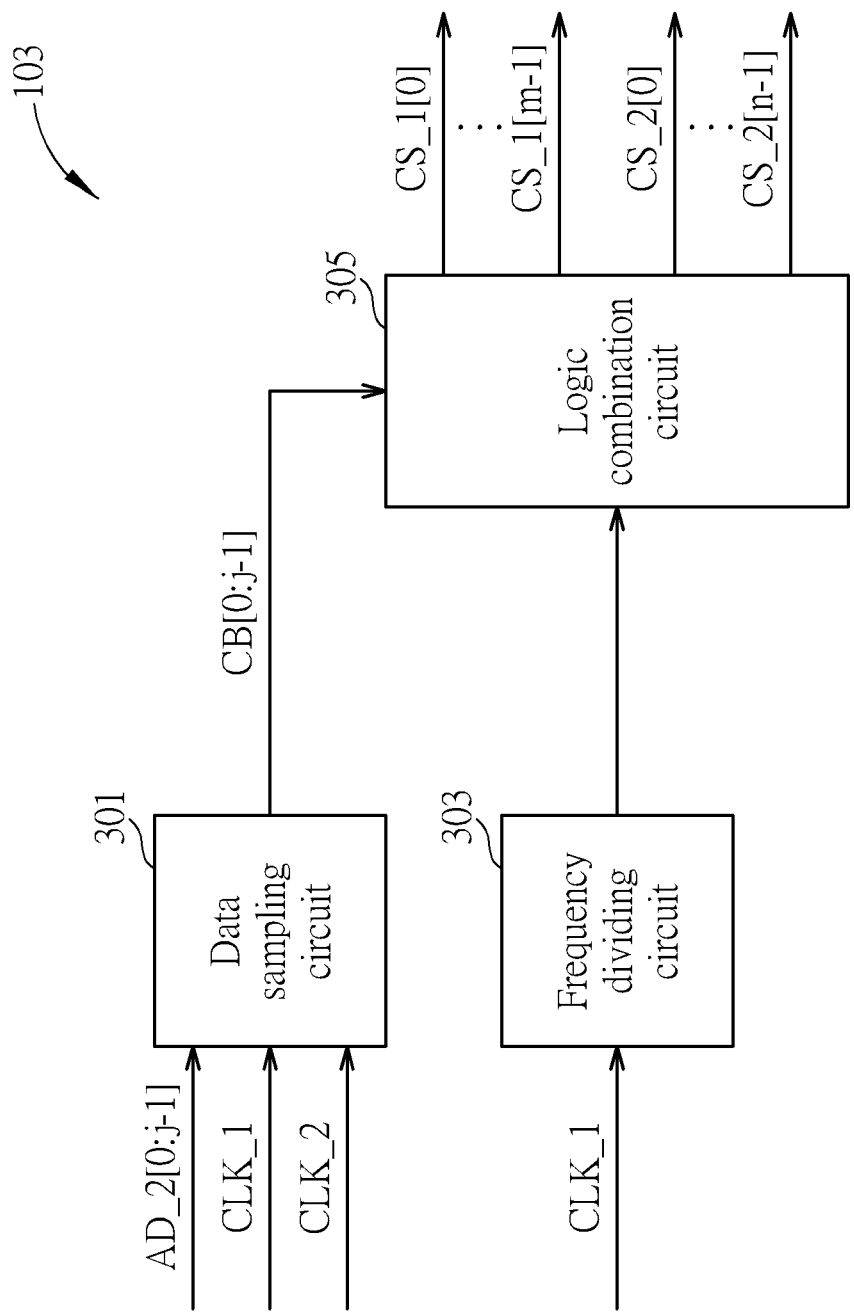
FIG. 3 is a block diagram illustrating circuit structures of the control signal generating circuit in FIG. 1 according to one embodiment of the present invention.

FIG. 3 is a block diagram illustrating circuit structures of the control signal generating circuit 103 in FIG. 1 according to one embodiment of the present invention. As illustrated in FIG. 3, the control signal generating circuit 103 comprises a data sampling circuit 301, a frequency dividing circuit 303 and a logic combination circuit 305. The data sampling circuit 301 configured to sample each bit of the second input address AD_2 [0:j−1] in sequence responding to the second clock signal CLK_2, and to output each bit of the second input address AD_2 [0:j−1] in sequence responding to the first clock signal CLK_1. The frequency dividing circuit 303 is configured to generate at least one frequency divided signal responding to the first clock signal CLK_1. The logic combination circuit 305 is configured to combine the frequency divided signal with the combined signal CB [0:j−1] of the data sampling circuit 301 to generate the first control signals CS_1[0:m−1], and configured to receive the frequency divided signal to generate the second control signals CS_2 [0:n−1].

Figure 4:
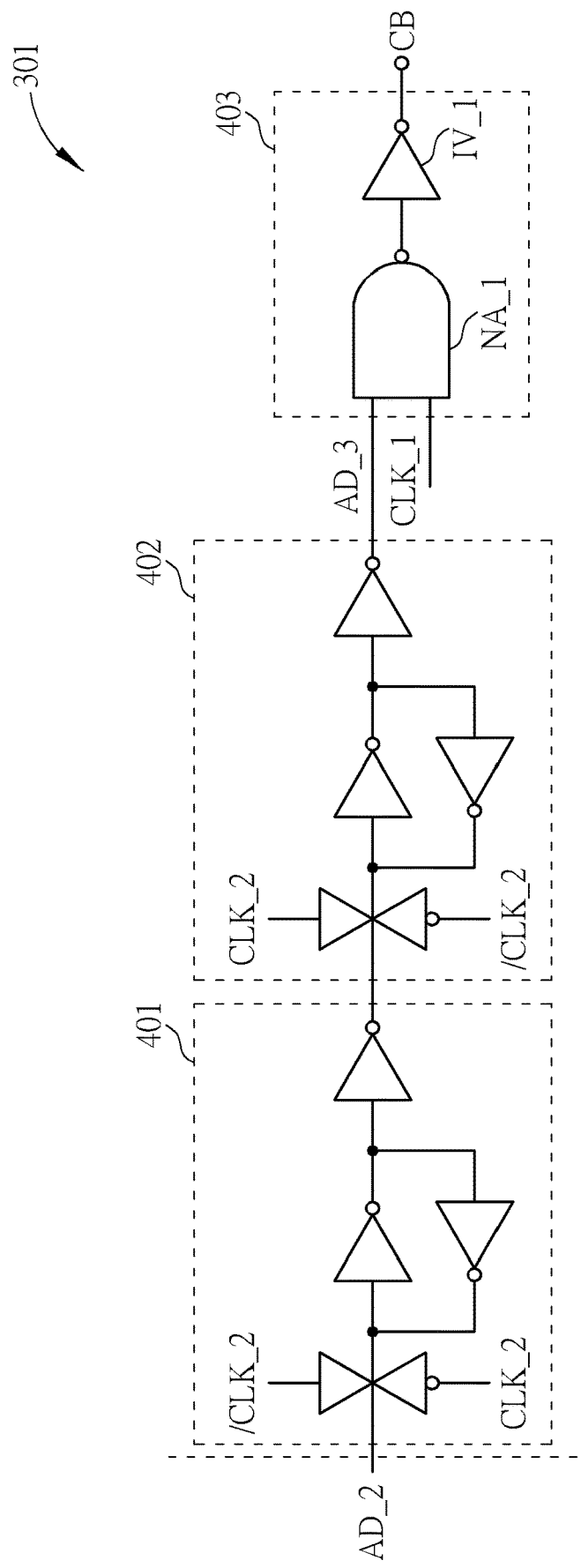
FIG. 4 is a circuit diagram illustrating circuit structures of the data sampling circuit in FIG. 3 according to one embodiment of the present invention.

FIG. 4 is a circuit diagram illustrating circuit structures of the data sampling circuit 301 in FIG. 3 according to one embodiment of the present invention. As illustrated in FIG. 4, the data sampling circuit 301 comprises a first sampling stage 401, a second sampling stage 402, and a logic circuit 403. The first sampling stage 401 is configured to sample bits of the second input address AD_2 [0:j−1] at falling edges of the second clock signal CLK_2 in sequence. The second sampling stage 402 is configured to sample bits of the second input address AD_2 [0: j−1] at rising edges of the second clock signal CLK_2 in sequence.

For example, when the second clock signal CLK_2 has a logic value 0, the first sampling stage 401 receives a first bit AD_2 [0] of the second input address AD_2 [0: j−1]. Also, when the second clock signal CLK_2 has a logic value 1, the first bit AD_2 [0] is sampled by the second sampling stage 402 and then transmitted to the logic circuit 403. Similarly, when the second clock signal CLK_2 has a logic value 0 again, the first sampling stage 401 receives a second bit AD_2 [1] of the second input address AD_2 [0: j−1], and when the second clock signal CLK_2 has a logic value 1 again, the second bit AD_2 [1] is sampled by the second sampling stage 402 and transmitted to the logic circuit 403 . . . and so on.

Exemplary circuits of the first sampling stage 401 and the second sampling stage 402 are illustrated in FIG. 4, but are not limited. Any circuit having the same function can be implemented as the first sampling stage 401 and the second sampling stage 402.

In this embodiment, the logic circuit 403 comprises a NAND logic gate NA_1 and an inverter IV_1. Therefore, if the first clock signal CLK_1 has a logic value 1 and a third input address AD_3 output by the second sampling stage 402 also has a logic value 1, the logic circuit 403 outputs the combined signal CB having a logic value 1. On the contrary, if the first clock signal CLK_1 has a logic value 1 and the third input address AD_3 output by the second sampling stage 402 has a logic value 0, the logic circuit 403 outputs the combined signal CB having a logic value 0. Accordingly, the combined signal CB is a combined signal of the first clock signal CLK_1 and the third input address AD_3, thus can also be regarded as a combined signal related with the first clock signal CLK_1 and the second input address AD_2.

Figure 5:
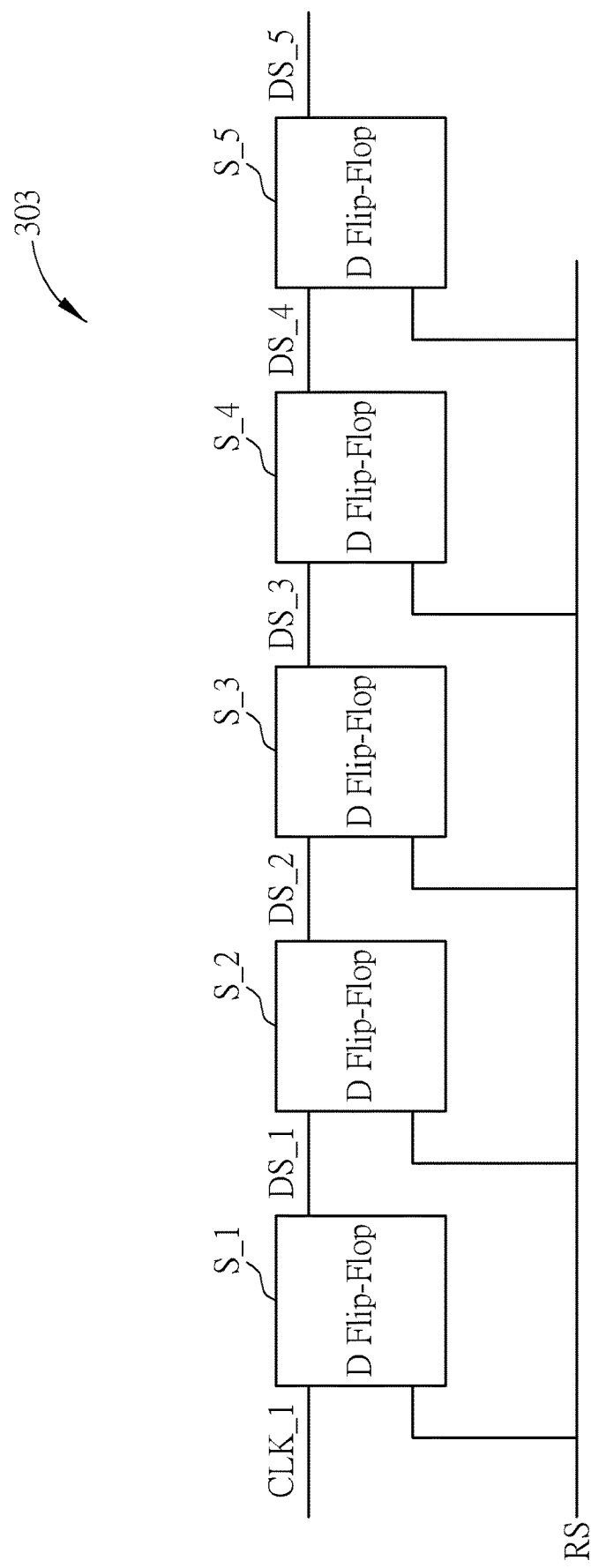
FIG. 5 is a circuit diagram illustrating circuit structures of the frequency dividing circuit in FIG. 3 according to one embodiment of the present invention.

FIG. 5 is a circuit diagram illustrating circuit structures of the frequency dividing circuit 303 in FIG. 3 according to one embodiment of the present invention. As illustrated in FIG. 5, the frequency dividing circuit 303 comprises five stages S_1-S_5, which can be flip flops, to respectively generate frequency divided signals DS_1-DS_5 responding to the first clock signal CLK_1.

In one embodiment, a frequency of the frequency divided signal DS_1 is half of the first clock signal CLK_1, a frequency of the frequency divided signal DS_2 is half of the frequency divided signal DS_1, a frequency of the frequency divided signal DS_3 is half of the signal DS_2, a frequency of the frequency divided signal DS_3 is half of the signal DS_2, a frequency of the frequency divided signal DS_4 is half of the signal DS_3, and a frequency of the frequency divided signal DS_5 is half of the frequency divided signal DS_4.

Figure 6:
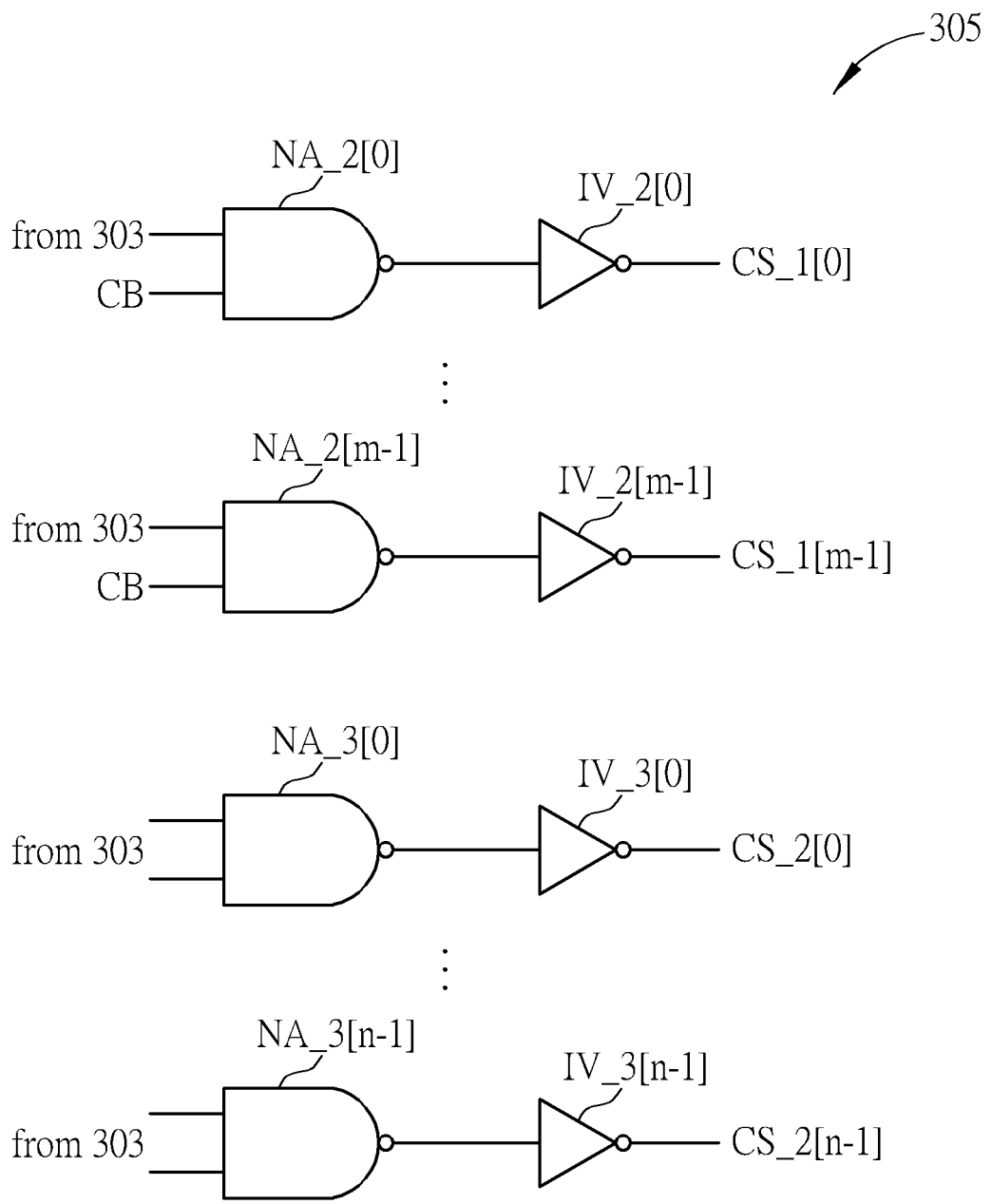
FIG. 6 is a signal diagram illustrating circuit structures of the logic combination circuit in FIG. 3 according to one embodiment of the present invention.

FIG. 6 is a circuit diagram illustrating circuit structures of the logic combination circuit 305 in FIG. 3 according to one embodiment of the present invention. As illustrated in FIG. 6, the logic combination circuit 305 comprises m second NAND logic gates NA_2, m second inverters IV_2, n third NAND logic gates NA_3, and n third inverters IV_3. Each of the second NAND logic gates NA_2 is configured to receive the frequency divided signals DS_1-DS_5 and the combined signal CB, and each of the second inverter IV_2 is configured to generate one of the first control signals CS_1 [0:m−1]. Each of the third NAND logic gate NA_3 is configured to receive the frequency divided signals, and each of the third inverter IV_3 is configured to generate one of the second control signals CS_2 0:n−1].

Please note the frequency dividing circuit 303 may comprises other numbers of stages, thus the input of the second NAND logic gate NA_2 and the third NAND logic gate NA_3 may correspondingly changes to achieve the same function.

Figure 7:
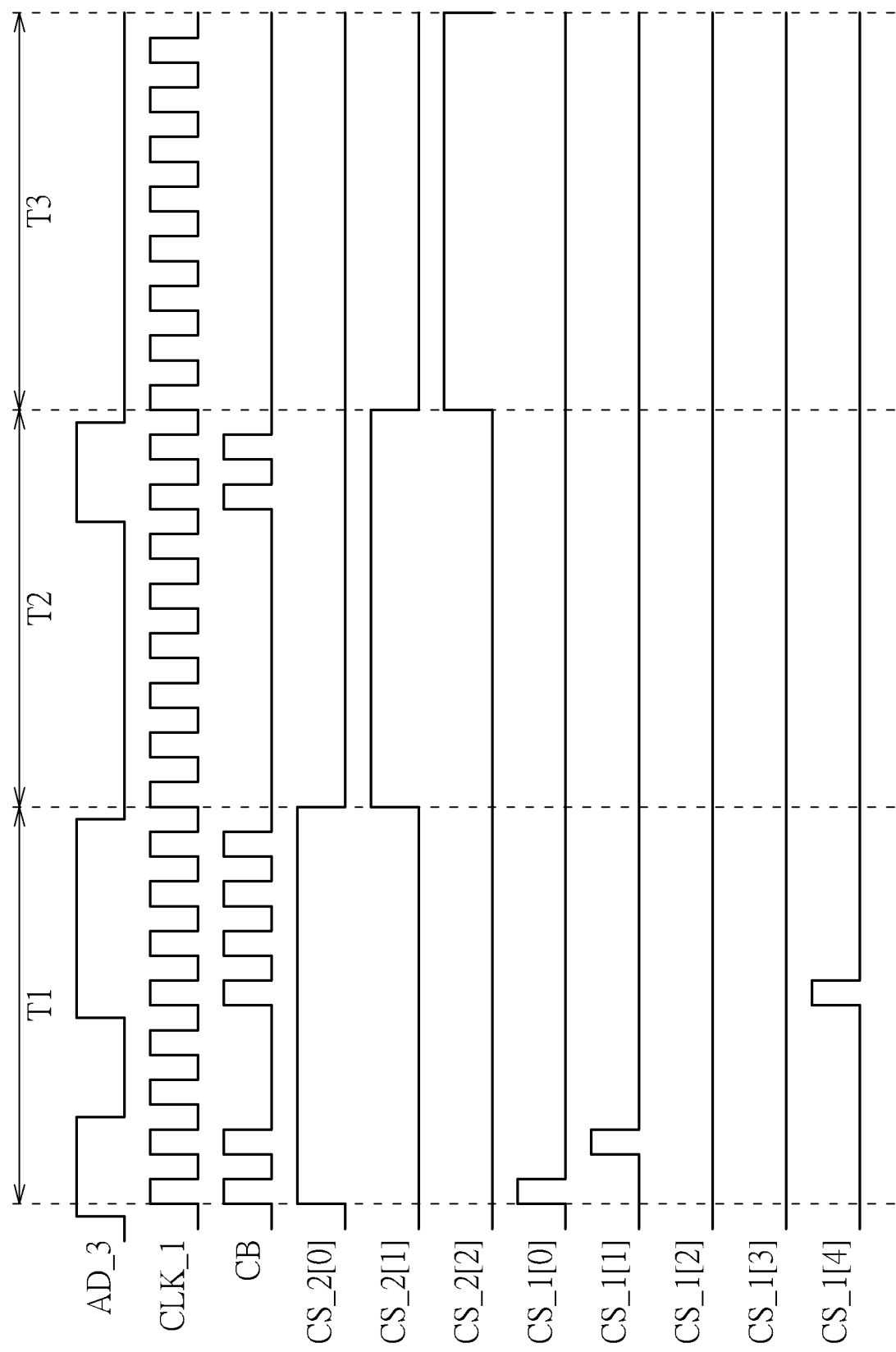
FIG. 7 is a schematic diagram illustrating signal wave forms for the signals and input addresses illustrated in the disclosed embodiments, according to one embodiment of the present invention.

FIG. 7 is a schematic diagram illustrating signal wave forms for the signals and addresses illustrated in FIG. 3-FIG. 6, according to one embodiment of the present invention.

In the embodiment of FIG. 7, the third input address AD_3 is 24 bits serial data AD_3[0:23]=[1 1 0 0 1 1 1 1 0 0 0 0 0 1 1 0 0 0 0 0 0 0 0]. The combined signal CB is a combined signal of the third input address AD_3 and the first clock signal CLK_1, thus is also 24 bits serial data. Responding to the first clock signal CLK_1, the combined signal CB has one bit value each time the first clock signal CLK_1 has a logic value 1. The logic combination circuit 305 receives the combined signal CB and at least one of the frequency divided signal from the frequency dividing circuit 303 and outputs one of the first control signals CS_1 based on the logic value of the combined signal CB when the first clock signal CLK_1 has a logic value 1. The second control signals CS_2 are only related to the frequency divided signal from the frequency dividing circuit 303 and are not related to the logic values of the combined signal CB.

Please refer to FIG. 7, in this embodiment, the second control signals CS_2 is 3 bits parallel data, thus the second control signal CS_2[0] has a logic value 1 during T1, which means $1^{st}$-$8^{th}$ periods of the first clock signal CLK_1. Similarly, the second control signal CS_2[1] has a logic value 1 during T2, which means $9^{th}$-$16^{th}$ periods of the first clock signal CLK_1, and the second control signal CS_2[2] has a logic value 1 during T3, which means $16^{th}$-$24^{th}$ periods of the first clock signal CLK_1. Further, the logic values of the first control signals CS_1 [0:7] are [1 1 0 0 1 1 1 1] in the $1^{st}$-$8^{th}$ periods of the first clock signal CLK_1 (T1), the logic values of the first control signals CS_1 [0:7] are [0 0 0 0 0 1 1] in the $9^{th}$-$16^{th}$ periods of the first clock signal CLK_1 (T2), and the logic values of the bits CS_1 [0:7] are [0 0 0 0 0 0 0 0] in the $17^{th}$-$24^{th}$ periods of the first clock signal CLK_1 (T3). For the convenience of understanding, FIG. 7 only illustrates part of the bits CS_1 [0:7] in T1.

Therefore, the 24 bits serial data of the third input address AD_3 are divided into 3 groups. The first group of the third input address AD_3 [1 1 0 0 1 1 1 1] are output responding to the first clock signal CLK_1 when the second control signal CS_2 [0]=1, the second group of the third input address AD_3 [0 0 0 0 0 0 1 1] are output responding to the first clock signal CLK_1 when the second control signal CS_2 [1]=1, and the third group of the third input address AD_3 [0 0 0 0 0 0 0 0] are output responding to the first clock signal CLK_1 when the second control signal CS_2 [2]=1

Figure 8:
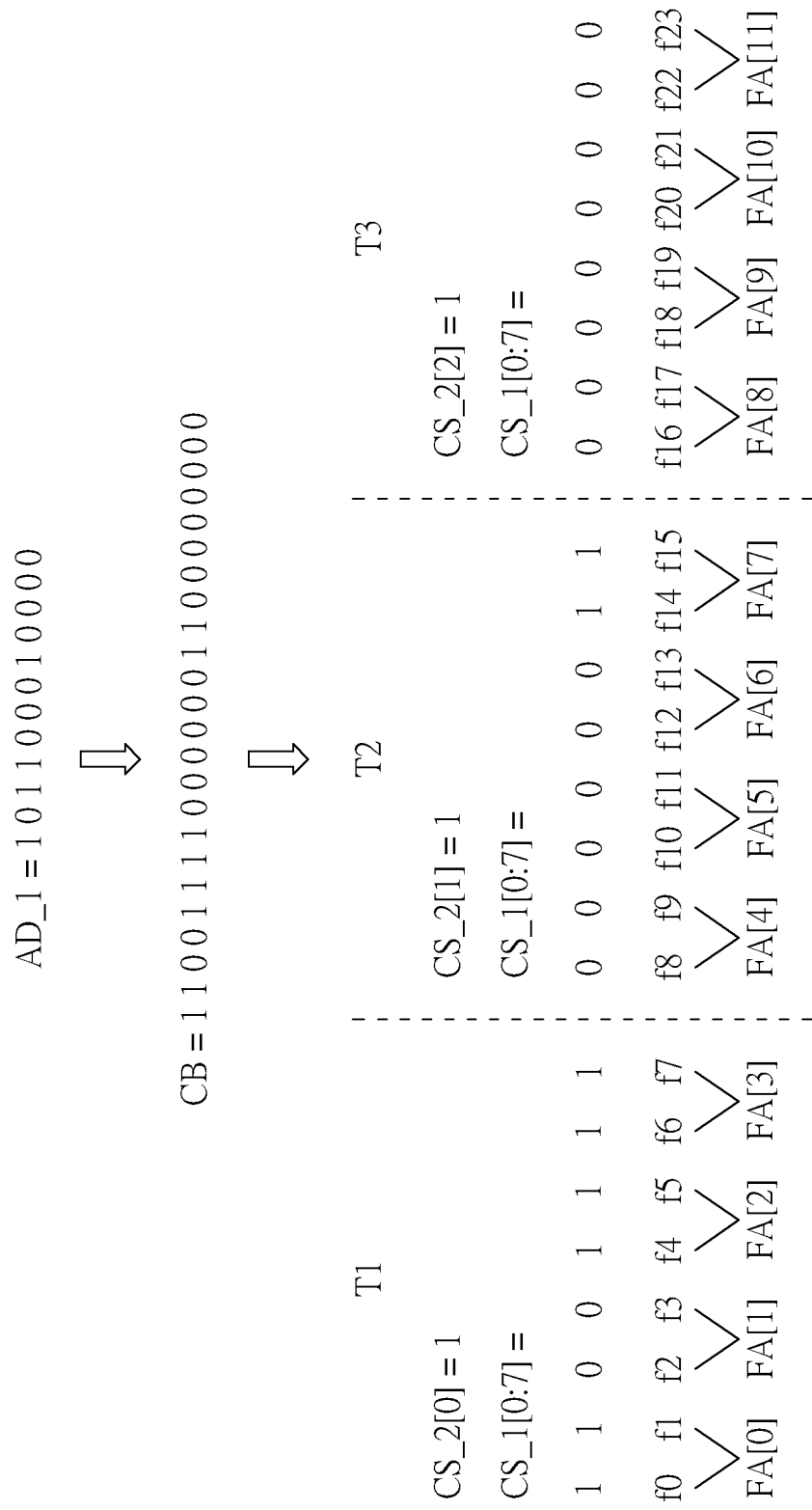
FIG. 8 is a schematic diagram illustrating relations between values for the signals and addresses illustrated in disclosed embodiments, according to one embodiment of the present invention.

FIG. 8 is a schematic diagram illustrating relations between the first address AD_1, the combined signal CB, the first control signals CS_1[0:7] and the second control signals CS_2[0:2]. FIG. 8 also illustrates relations between the fuses of the E-fuse group 105 in FIG. 1 and the first address AD_1, the combined signal CB, the first control signals CS_1[0:7] and the second control signals CS_2[0:2]. Please refer to FIG. 8, if the first input address AD_1 [0:11]=[1 0 1 1 0 0 0 1 0 0 0 0], the combined signal CB [0:23]=[1 1 0 0 1 1 1 1 0 0 0 0 0 0 1 1 0 0 0 0 0 0 0 0]. In the $1^{st}$-$8^{th}$ periods of the first clock signal CLK_1 (T1), second control signals CS_2 [0:2]=[1, 0, 0], and the first control signals CS_1[0:7]=[1 1 0 0 1 1 1 1], which are used for determining whether the fuses f0-f7 in the E-fuse group 105 are burned or not. Also, in the $9^{th}$-$16^{th}$ periods of the first clock signal CLK_1 (T2), second control signals CS_2 [0:2]=[0, 1, 0], and the first control signals CS_1[0:7]=[0 0 0 0 0 0 1 1], which are used for determining whether the fuses f8-f15 in the E-fuse group 105 are burned or not. Besides, in the $17^{th}$-$24^{th}$ periods of the first clock signal CLK_1 (T3), second control signals CS_2 [0:2]=[0, 0, 1], and the first control signals CS_1[0:7]=[0 0 0 0 0 0 0 0], which are used for determining whether the fuses f16-f23 in the E-fuse group 105 are burned or not. The fuses f0-f23 mean different fuses in the E-fuse group 105.

In one embodiment, whether the fuses in the E-fuse group 105 are burned or not are determined by whether a corresponding first control signal CS_1 and a corresponding second control signal CS_2 are simultaneously 1. In the embodiment of FIG. 8, in T1, since CS_2[0]=1, CS_1[0]=1, CS_1[1]=1, CS_1[4]=1, CS_1[5]=1, CS_1[6]=1, CS_1[7]=1, thus the fuses f0,f1,f4,f5,f6,f7 are burned but the fuses f2, f3 are not burned. If any one of the fuses f0, f1 is successfully burned, the fail address FA[0]=1. Also, if any one of the fuses f4, f5 is successfully burned, the output address FA[2]=1, and if any one of the fuses f6, f7 is successfully burned, the output address FA[3]=1.

Briefly, in the embodiments of FIG. 7 and FIG. 8, the first input address AD_1 is 12 bits data and the second input address data AD_2 is 24 bits data since a frequency of the first clock signal CLK_1 is twice of a frequency of the second clock signal CLK_2. The control signal generating circuit 103 in FIG. 1 receives and decodes the 24 bits data (the second input address data AD_2), to generate eight first control signals CS_1 and three second control signals CS_2, wherein 8 and 3 are factors of 24. However, the scope of the present invention is not limited to such example. In other embodiments, the control signal generating circuit 103 receives and decodes the 24 bits data, to generate m eight first control signals CS_1 and n second control signals CS_2. The m and n can be any positive integers, for example, m=12, n=2 or m=6, n=4.

Figure 9:
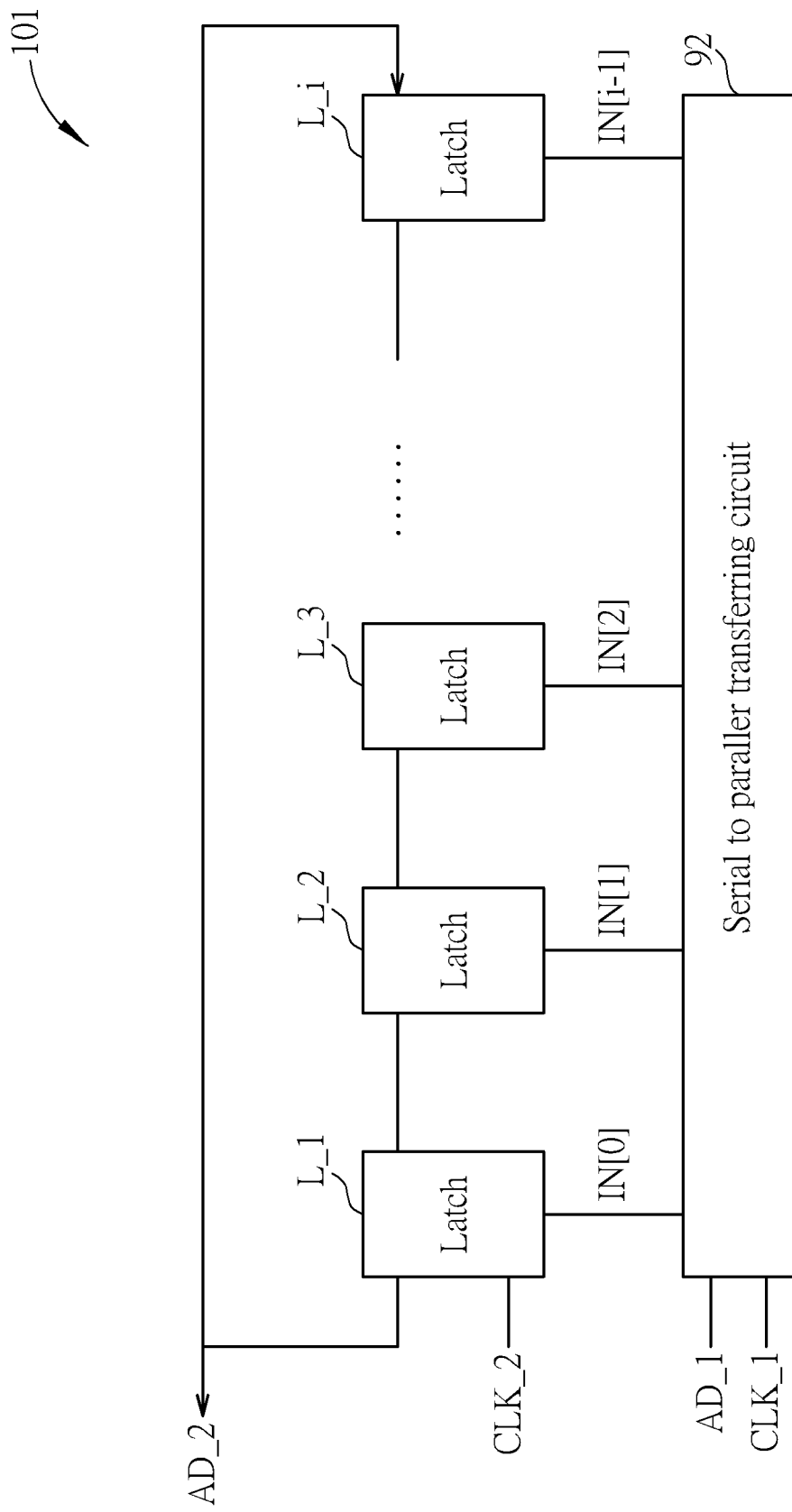
FIG. 9 is a circuit diagram illustrating a ring latch circuit according to one embodiment of the present invention.

FIG. 9 is a circuit diagram illustrating a circuit for generating the second input address AD_2 according to one embodiment of the present invention. As illustrated in FIG. 9, the ring address latch 101 receives the first input address AD_1 to output the second input address AD_2. The ring latch circuit 101 comprises a serial to parallel transferring circuit 92 and a plurality of latch stages L_1~L_i, which can be implemented by latches.

During a writing operation, the parallel transferring circuit 92 receives the first input address AD_1 in series responding the first clock signal CLK_1, and writes i bits data to the latch stages L_1-L_i in sequence. For example, at the first rising edge of the first clock signal CLK_1, a first bit of the first input address AD_1 is written as the input bit IN[0] to the latch stage L_1. Also, at the first falling edge of the first clock signal CLK_1, a second bit of the first input address AD_1 is written as the input bit IN[1] to the latch stage L_2 . . . and so on.

During a burning operation the data stored in each latch stage is shifted to a next latch stage corresponding to the second clock signal CLK_2, and the data stored in the latch stage L_1 is transmitted outside to the control signal generating circuit 103 in FIG. 1. For example, during the burning operation, the input bit IN [0] which is stored in the latch stage L_1 at a first rising edge of the second clock signal CLK_2 is transmitted outside to the control signal generating circuit 103 in FIG. 1. Also, the input bit IN[0] is written to the lath stage L_i at a second falling edge. At the same time, the input bit IN[i−1] in the latch stage L_i is written to the latch stage Li-1. For example, the input bit IN[1] in the latch stage L_2 is written to the latch stage L_1, and the input bit IN[2] in the latch stage L_3 is written to the latch stage L_2.

After that, the input bit IN [1] which is stored in the latch stage L_1 at a second rising edge of the second clock signal CLK_2 is transmitted outside to the control signal generating circuit 103 in FIG. 1. Also, the input bit IN[1] is written to the lath stage L_i at a third falling edge. At the same time, the input bit IN[i] in the latch stage L_i is written to the latch stage L_i−1. For example, the input bit IN[2] in the latch stage L_2 is written to the latch stage L_1, and the input bit IN[3] in the latch stage L_3 is written to the latch stage L_2 . . . and so on. Please note, in such embodiment, a frequency of the second clock signal CLK_2 is 1/K of a frequency of the first clock signal CLK_1. According, the second input address AD_2 output by the ring latch circuit 101 to the control signal generating circuit 103 is i*K bits data, corresponding to the first clock signal CLK_1.

In a conventional latch, the input address is not backup, thus the input address is clear after the burning operation is performed. However, the input address could not be recovered if some error occurs for the burning operation. The ring latch 101 illustrated in FIG. 9 can backup the input address while the burning operation is performed, to solve such problem.

A specific example is provided to explain the flow of FIG. 1 to FIG. 9. In one embodiment, the first input address AD_1 is serial 12 bits data (AD1[0:11]=[1 0 1 1 0 0 0 1 0 0 0 0]). After processed by the serial to parallel transferring circuit 92 responding to the first clock signal CLK_1, 12 bits parallel input bits are generated (IN[0]-IN[11]). Thereafter, if a burn command is received, the input bits IN[0]-IN[11] are sequentially output to the control signal generating circuit 103 to generate serial 24 bits data AD_2[0:23]=[1 1 0 0 1 1 1 1 0 0 0 0 0 0 1 1 0 0 0 0 0 0 0 0]. In this embodiment, the above-mentioned K is 2, which means a frequency of the second clock signal CLK_2 is ½ of a frequency of the first clock signal CLK_1.

Please refer to FIG. 3, after the data sampling circuit 301 of the control signal generating circuit 103 receives the second input address AD_2 responding to the second clock signal CLK_2, the data sampling circuit 301 generates the combined signal CB responding to the first clock signal CLK_1. If the combined signal CB has a logic value 1, one of the first control signals CS_1[0:7] has a logic value 1 when the first clock signal CLK_1 has a logic value 1. At the same time, if one of the second control signals CS_2 has a logic value 1, the corresponding fuse in the E-fuse group 105 is burned.

In above-mentioned embodiments, each bit for the fail address FA is determined by two fuses, thus a frequency of the second clock signal CLK_2 used for the burning operation is selected as half of a frequency of the first clock signal CLK_1 used for the writing operation, However, it does not mean to limit the present invention. The above-mentioned embodiments are only implementation examples of the present invention. The scope of the present invention should base on claims illustrated herein after.

Also, in view of above-mentioned embodiments, the clock signal and the address data are combined such that only transmission line for the combined signal is needed rather than two transmission lines respectively for the clock signal and the address data. Additionally, the latch circuit can be implemented by a ring circuit, thereby the address data can be backup during the burning operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An E-fuse circuit, comprising:
   a ring address latch, configured to receive a first input address arranged in serial i bits responding to a first clock signal, and to output a second input address arranged in serial j bits responding to a second clock signal, wherein a frequency of the first clock signal is k times of a frequency of the second clock signal and k is a positive integer;
   a control signal generating circuit, coupled to the ring address latch, configured to receive the second input address, and to decode the second input address to generate first control signals with m bits and second control signals with n bits, wherein the first control signals and the second control signals are transmitted in parallel, and m, n are factors of j; and
   an E-fuse group, coupled to the control signal generating circuit, comprising j fuses;
   wherein if any one of the first control signals has a first logic value 1 and any one of the second control signals has the first logic value 1, a corresponding fuse the E-fuse group is burned.

2. The E-fuse circuit of claim 1,
   wherein the E-fuse group comprises bit determining circuits for i bits, wherein each one of the bit determining circuits comprises k fuses;
   wherein if any one of the first control signals has the first logic value and anyone of the second control signals has the first logic value, the k fuses in one of the bit determining circuits are burned, wherein j=k*i.

3. The E-fuse circuit of claim 1, wherein the control signal generating circuit comprises:
a data sampling circuit, configured to sample each bit of the second input address in sequence responding to the second clock signal, and to output each bit of the second input address in sequence responding to the first clock signal.

4. The E-fuse circuit of claim 3, wherein the control signal generating circuit comprises:
a frequency dividing circuit, configured to generate at least one frequency divided signal responding to the first clock signal.

5. The E-fuse circuit of claim 4, wherein the control signal generating circuit comprises:
a logic combination circuit, configured to combine the frequency divided signal with output of the data sampling circuit to generate the first control signals, and configured to receive the frequency divided signal to generate the second control signals.

6. The E-fuse circuit of claim 4, wherein the data sampling circuit comprises:
a first sampling stage, configured to sample bits of the second input address at falling edges of the second clock signal in sequence;
a second sampling stage, coupled to first sampling stage, configured to sample bits of the second input address at rising edges of the second clock signal in sequence; and
a logic circuit, coupled to the second sampling stage.

7. The E-fuse circuit of claim 6, wherein an output of the logic circuit has a logic value 1 if the first clock signal has a logic value 1 and a bit output by the second sampling state has a logic value 1.

8. The E-fuse circuit of claim 1, wherein the ring latch circuit comprises a serial to parallel transferring circuit and i latch stages.

9. The E-fuse circuit of claim 8, wherein the serial to parallel transferring circuit receives the first input address in series responding the first clock signal and sequentially writes the first input address to the i latch stages during a writing operation.

10. The E-fuse circuit of claim 9, wherein data stored in each of the i latch stages is shifted to a next stage and data stored in the first latch stage of the i latch stages is transmitted outside to the control signal generating circuit, during a burning operation.

* * * * *